(12) United States Patent
Sumriddetchkajorn (10) Patent No.: US 6,765,193 B2
(45) Date of Patent: Jul. 20, 2004

(54) OPTICAL TOUCH SWITCH STRUCTURES

(75) Inventor: Sarun Sumriddetchkajorn, Pathumthani (TH)

(73) Assignee: National Science and Technology Development Agency, Bangkok (TH)

( * ) Notice: Subject to any disclaimer, the term of this patent is extended or adjusted under 35 U.S.C. 154(b) by 10 days.

(21) Appl. No.: 10/224,590

(22) Filed: Aug. 21, 2002

(65) Prior Publication Data

US 2003/0052257 A1 Mar. 20, 2003

(30) Foreign Application Priority Data

Aug. 21, 2001 (TH) ................................................ 067838

(51) Int. Cl.$^7$ ............................ G09G 5/00; G06M 7/00; G01J 1/36
(52) U.S. Cl. .................... 250/221; 250/227.22; 345/176
(58) Field of Search ............................ 341/31; 345/166, 345/173, 175, 176; 250/221, 222.1, 216, 227.11, 227.22, 555, 556

(56) References Cited

U.S. PATENT DOCUMENTS

| | | | | |
|---|---|---|---|---|
| 3,772,685 A | * | 11/1973 | Masi | |
| 4,254,333 A | * | 3/1981 | Bergstrom | |
| 4,542,375 A | * | 9/1985 | Alles | |
| 4,629,884 A | * | 12/1986 | Bergstrom | |
| 4,814,600 A | * | 3/1989 | Bergstrom | |
| 5,942,761 A | * | 8/1999 | Tuli | 250/556 |
| 6,166,370 A | * | 12/2000 | Sayag | |
| 2002/0020808 A1 | * | 2/2002 | Kado | |

* cited by examiner

*Primary Examiner*—David Porta
*Assistant Examiner*—David C. Meyer
(74) *Attorney, Agent, or Firm*—Reed Smith LLP; Stanley P. Fisher, Esq.; Juan Carlos A. Marquez, Esq.

(57) ABSTRACT

Optical touch switches are implemented based on the use of light total internal reflection and light scattering concepts. The optical touch switch basically consists of a light source, a light guide, a photodetector, and an electronic controller. The fingertip touching on the touching surface of the optical touch switch leads to the change in electrical current produced by the photodetector. As a result, the electronic control box senses this change of electrical current and allows the electrical load to stay at the desired state. Key advantages include ease of implementation, prevention of the light beam incident directly on the user's eyes, and ability to accept both strong and weak mechanical forces from users.

11 Claims, 6 Drawing Sheets

OPTICAL TOUCH SWITCH STRUCTURES

BACKGROUND OF THE INVENTION

Today, user interaction between machines and people is generally implemented by the use of conventional mechanical switches. Although the mechanical switch offers low cost, robustness, and reliability, it is not suitable, due to its mechanical moving parts that must move several millimeters, for some disabled people who cannot exert enough force to press on the switch. Another problem for the commonly used mechanical switch is that the user cannot see it at night and therefore an additional small light source is inserted in or placed along the side of some mechanical switches. The force problem in the mechanical switch can now be alleviated by using a touch switch based on surface acoustic wave technology [E. Dieulesaint, D. Royer, O. Legras, and A. Chaabi, "Acoustic plate mode touch screen," *Electronics Letters*, Vol. 27, pp. 49–51, January 1991]. Another approach is to use a piezoelectric-based touch switch that gives a small output voltage for activating the desired electrical load when there is a mechanical force on the active area of the switch. However, a commercial piezoelectric-based touch switch requires a strong force of 3–5 Newtons and a specially designed electrical circuit to prevent a high output saturation voltage [Catalog RS Components, RS International Division, P. O. Box 99, Corby, Northants NN17 PRS, England, September 94–February '95]. The need of using a weaker activating force can be accomplished by using capacitive-based touch switch technology [N. Platt, W. Schilling, B. Goetz, and U. Kreiter, "Touch switch with flexible intermediate conductive spacer as sensor button," U.S. Pat. No. 5,917,165, Jun. 29, 1999]. Similar to the piezoelectric-based technology, this capacitive-based touch switch needs an additional electrical circuit to prevent the unwanted output voltage disturbance due to the electrostatic inductance change when the finger is approaching or touching the active area of the touch switch. Another type of touch switch is based on the use of resistive membranes that still need a typical contact movement of membrane in submillimeters in order to provide a reliable switching action and sufficient insulation between contacts [E. So, H. Zhang, and Y. -S. Guan, "Sensing contact with analog resistive technology," *IEEE Conference on Systems, Man, and Cybernetics*, Vol. 2, pp. 806–811, Japan, October 1999]. This level of mechanical movement in resistive touch switch technique also introduces a degree of wear-and-tear that limits the life of the touch switch. Furthermore, these touch switch technologies also require an additional light source embedded in the touch switch module in order to be able to use in the dark area. Hence, it would be highly desirable to have a touch switch structure where the contact switching concept is inherently based on the use of light beam.

Previously, two types of optical touch switch were proposed by means of light reflection [K. Friedrich, G. Straimer, and B. Godesberg, "Reflection type contactless touch switch having housing with light entrance and exit apertures opposite and facing," U.S. Pat. No. 3,621,268, Nov. 16, 1971] and light blocking methods [C. R. Fisber, "Optical keyboard," U.S. Pat. No. 43,873,607, Jun. 7, 1983]. Nonetheless, the disadvantage of these previous optical touch switch structures is that more than one spatially fixed photodetectors are utilized to detect the optical beam reflected and scattered from the user's finger. In addition, they are inappropriate for use in real life as the free-space propagating light beam emanating from the touching surface of the switch can easily hit the user's eyes. Hence, to achieve a user-friendly optical touch switch, the present invention uses concepts of light total internal reflection (TIR) and light scattering to implement an optical touch switch. The key main idea comes from the fact that the evanescent optical field at the TIR surface can be coupled out when a component, whose refractive index is close to the index of refraction of the TIR material, is placed on the TIR surface. The scattered light is generated at this TIR surface as well. The TIR- and light scattering-based optical touch switch concepts offer several additional key advantages including ease of implementation, prevention of the light beam incident directly on the user's eyes, and ability to accept both strong and weak mechanical activating forces. Note that since the discovery of TIR of light in 1800's by John Tyndall [B. E. A. Saleh and M. C. Teich, *Fundamentals of Photonics*, John Wiley & Sons, 1991], the TIR principle has been employed in several applications including a fiber-optic communication system, an optical switch [S. K. Sheem, "Total internal reflection integrated-optics switch: a theoretical evaluation," *Applied Optics*, Vol. 17, No. 22, pp. 3679–3687, November 1979; R. I. MacDonald, "Deflection optical matrix switch," U.S. Pat. No. 6,005,993, Dec. 21, 1999], an optical beam deflector [M. B. Chang, "Total internal reflection deflector," *Applied Optics*, Vol. 21, No. 21, pp. 3879–3883, November 1992], a fiber-optic hydrophone [W. B. Spillman Jr. and D. H. McMahon, "Frustrated-total-internal-reflection multimode fiber-optic hydrophone," Applied Optics, Vol. 19, No. 1, pp. 113–117, January 1980], an interferometer [S. Sainov, V. Sainov, and G. Stoilov, "Interferometer based on total internal reflection," *Applied Optics*, Vol. 34, No. 16, pp. 2848–2852, June 1995; W. Zhou and L. Cai, "Interferometer for small-angle measurement based on total internal reflection," *Applied Optics*, Vol. 37, No. 25, pp. 5957–5963, September 1998], a fiber-optic sensor [K. Rahnavardy, V. Arya, A. Wang, and J. M. Weiss, "Investigation and application of the frustrated-total-internal-reflection phenomenon in optical fibers," *Applied Optics*, Vol. 36, No. 10, pp. 2183–2187, April 1997], the measurement of refractive index [H. Li and S. Xie, "Measurement method of the refractive index of biotissue by total internal reflection," *Applied Optics*, Vol. 35, No. 10, pp. 1793–1795, April 1996; M. -H. Chiu, J. -Y. Lee, and D. -C. Su, "Refractive-index measurement based on the effects of total internal reflection and the uses of heterodyne interferometry," *Applied Optics*, Vol. 36, No. 13, pp. 2936–2939, May 1997], spectroscopy [J. S. Loring and D. P. Land, "Theoretical determination of parameters for optimum surface specificity in overlayer attenuated-total-reflection infrared spectroscopy," *Applied Optics*, Vol. 37, No. 16, pp. 3515–3526, June 1998], a fingerprint input device [J. N. Monroe, "Fingerprint observation and recording apparatus," U.S. Pat. No. 3,527,535, Sep. 8, 1970], and microscopy [P. S. Carney and J. C. Schotland, "Three-dimensional total internal reflection microscopy," *Optics Letters*, Vol. 26, No. 14, pp. 1072–1074, July 2001].

SUMMARY OF THE INVENTION

The present invention is directed to an optical touch switch being operated by contact that incorporates a light source for illuminating the optical touch switch module and giving the optical beam to sense the mechanical activating force applied on the touching surface of the optical touch switch; a light guide having at least one surface that the total internal reflection or light scattering can be generated; at least one photodetector for detecting light due to total internal reflection or light scattering phenomenon; imaging system for controlling the size of the optical beam and direction of light propagation; spatial filters for controlling the size of the optical beam and propagation direction of light as well as for suppressing the unwanted optical noise; and an electronic control box for sensing the change of electrical current produced by the photodetector and for controlling the electrical load connected at the output of the electronic control box.

In one embodiment of the optical touch switch, the light guide is a triangle prism. In another embodiment, the light guide is a Rhomboid prism. In another embodiment, the light guide is a Dove prism. In a further embodiment, the light guide is a penta prism or polyangle prism. In an even further embodiment, the light guide is a slab rectangular light guide made from plastic, glass, or polymer. In another embodiment, the light guide is an optical fiber made from glass, plastic, or polymer. Variations to the structure of the light guide include the light guide having at least one touching surface; the total internal reflection point along the touching surface of the light guide having at least one point; the position of light scattering along the touching surface of the light guide claim having at least one point; and the surface of the touching surface of the light guide being divided into a light diffusing area, a light blocking area, and a sensing area.

Optical touch switches are implemented based on the use of light total internal reflection and light scattering concepts. The optical touch switch basically consists of a light source, a light guide, a photodetector, and an electronic controller. The fingertip touching on the touching surface of the optical touch switch leads to the change in electrical current produced by the photodetector. As a result, the electronic control box senses this change of electrical current and allows the electrical load to stay at the desired state. Key advantages include ease of implementation, prevention of the light beam incident directly on the user's eyes, and ability to accept both strong and weak mechanical forces from users.

DETAILED DESCRIPTION OF THE PREFERRED EMBODIMENTS

Figure 1:
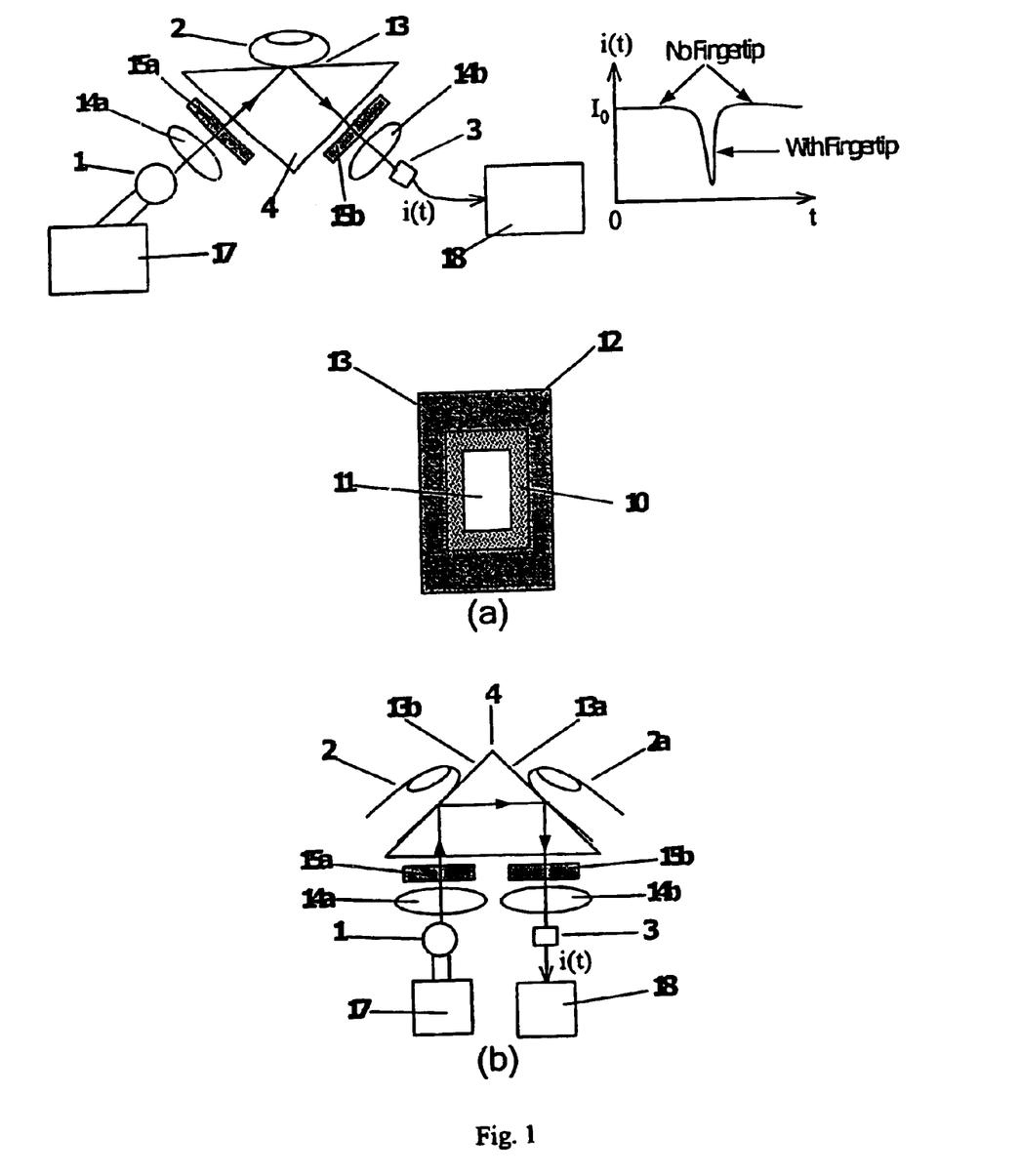
FIGS. 1(a) and 1(b) show an optical touch switch architecture based on the use of one triangle prism.

FIGS. 1(a) and 1(b) show the architecture of the first optical touch switch according to the present invention that uses one triangle prism 4. The way this triangle prism-based optical touch switch work is as follows. From FIG. 1(a), an optical beam from a light source 1 travels through the triangle prism 4 and is totally internally reflected from the touching surface 13 to the photodetector 3. At the touching surface 13, there is an evanescent field whose amplitude falls to $1/\exp(1)$ at a distance from the touching surface 13 equal to the skin depth. Then, the output optical beam falls on the photodetector 3 in which the light is converted into the electrical current and is fed to the electrically controlled circuit such as a simple operational amplifier (Op-Amp)-based comparator. The TIR-based optical touch switch can be operated into 2 modes depending on the design of the electrical control circuit. One touch switch operation is the "touch-on-release-off" or "touch-off-release-on" mode. Another mode of touch switch operation is the "touch-on-touch-off" or "touch-off-touch-on". For the "touch-off-release-on" switch operation, when there is no fingertip 2 placed on the touching surface 13 of the TIR-based optical touch switch, the electrical control box receives a constant electrical current. As a result, it will allow the desired electrical load to stay at the ON state. On the other hand, when the fingertip 2 is placed on the touching surface 13 of the TIR-based optical touch switch, the evanescent wave is coupled out of the triangle prism 4 through a thin layer of liquid on the fingertip 2, leading to the change of electrical current at the photodetector 3. If the electrical control box can sense this change of electrical current, it will turn the desired electrical appliance to the OFF state. The amount of changes in electrical current can be adjusted via the mechanical force applied on the touching surface 13, the surface roughness of the touching surface 13, the cross-section area of the optical beam at the touching surface 13, the cleanness of the finger and the touching surface 13, the number of TIR points along the touching surface 13, and even the threshold voltage at the electrical Op-Amp based comparator. For example, if the cross-section area of the optical beam at the touching surface 13 is larger than the fingertip 2 and the active area of the photodetector 3 is large compared to the size of the optical beam, the change in electrical current at the photodetector 3 will be small and difficult to detect, leading to a less sensitive optical touch switch with the requirement of a stronger mechanical activating force. Increasing the number of TIR points via the use of a thinner and longer prism, an optical fiber, or a thin rectangular slab lightguide as well as decreasing the size of the optical beam can make the optical touch switch more sensitive to a weaker mechanical activating force. Additional lenses 14a, 14b and spatial filters 15a, 15b can also be inserted in the optical beam path to control the propagation direction of light beam and the size of the optical beam as well as to suppress the unwanted optical noise. In addition, the unwanted light from outside touch switch can be reduced by special design the touching surface 13 to have one zone as a diffuser 10, one zone for placing fingertip 11, and another zone for light blocking 12. FIG. 1(b) shows another configuration of the triangle prism-based optical touch switch in which there are two touching surfaces 13a, 13b on the triangle prism 4.

Figure 2:
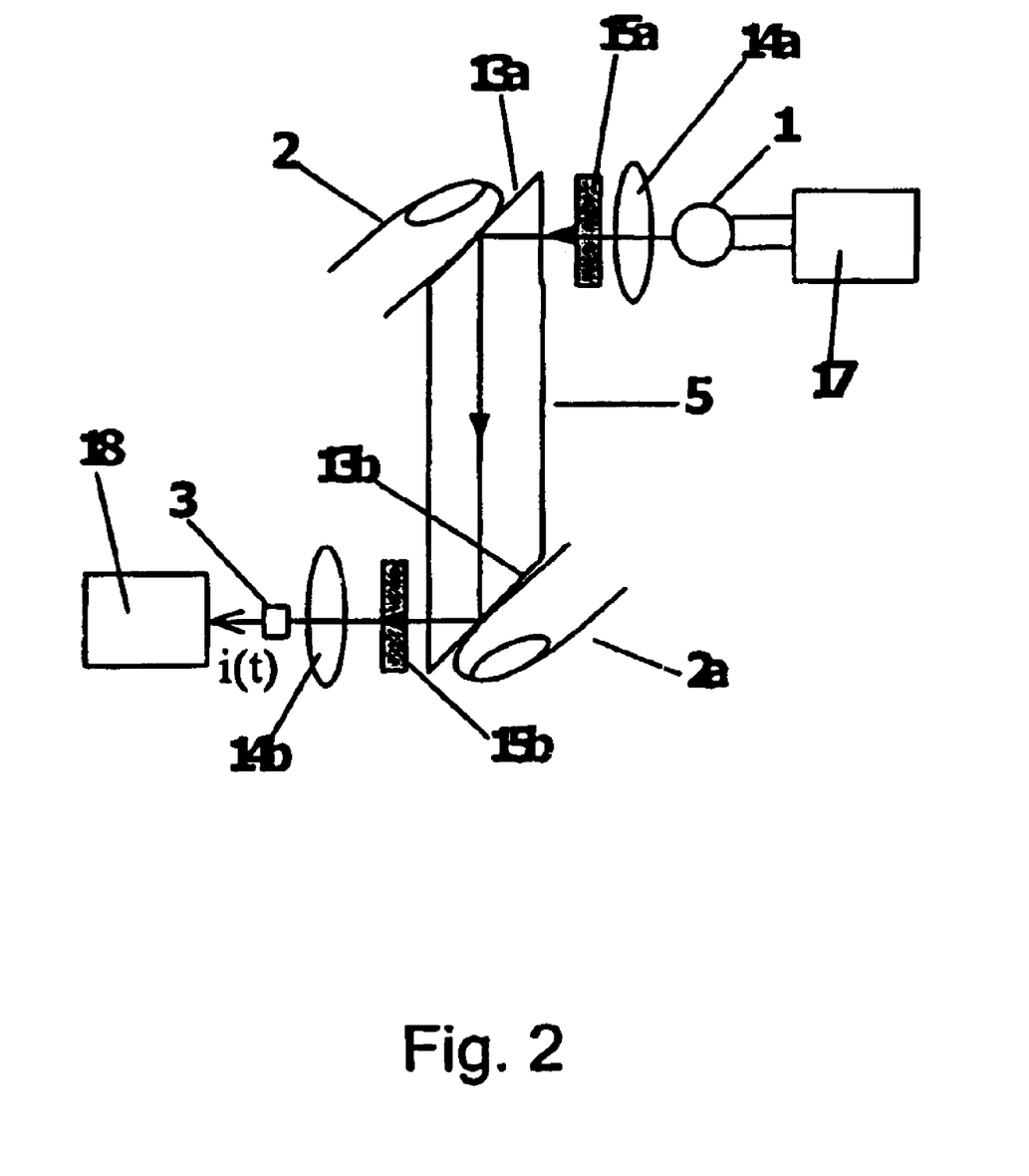
FIG. 2 shows an optical touch switch architecture based on the use of one Rhomboid prism.

FIG. 2 shows the optical touch switch structure that uses one Rhomboid prism 5. This optical touch switch structure also provides two touching surfaces 13a, 13b on the Rhomboid prism 5. Inherently, the Rhomboid prism 5 structure offers a desired separation distance between two touching surfaces 13a, 13b.

Figure 3:
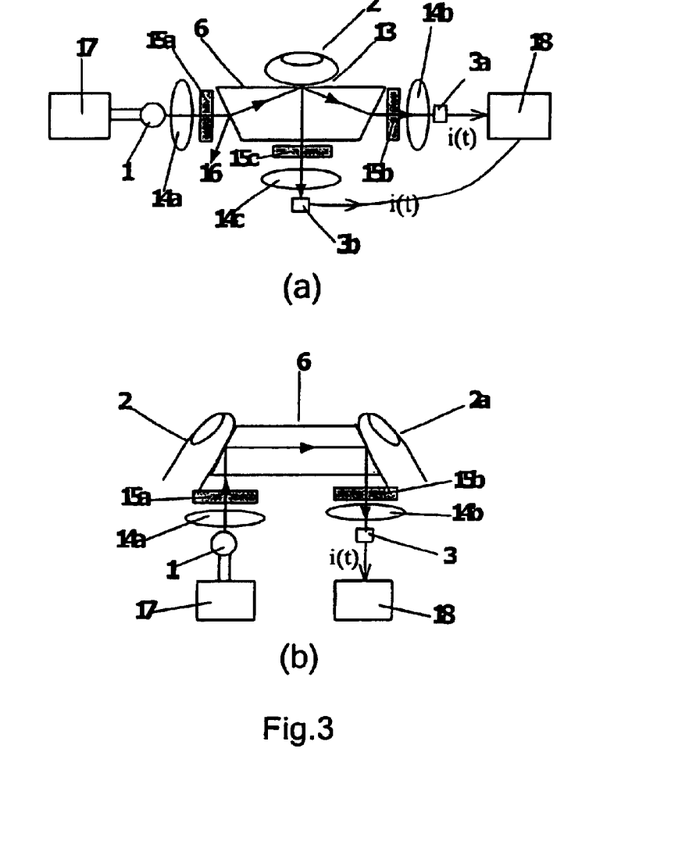
FIGS. 3(a) and 3(b) show an optical touch switch architecture based on the use of one Dove prism.

FIGS. 3(a) and 3(b) show the Dove prism-based optical touch switch architecture that either light TIR or light scattering concept is used. If the TIR principle is utilized as shown in FIG. 3(a), the photodetector 3a is used for sensing the change of optical power. In addition, in this case the arrangement of light source 1 and the photodetector 3a are in line, leading to the ease of implementation. For light scattering concept-based optical touch switch, the change of the optical beam can be sensed by using the photodetector 3b. Combination of light TIR and light scattering concepts can make the optical touch switch more sensitive to the mechanical activating force. FIG. 3(b) shows another arrangement of the Dove prism-based optical touch switch structure in which two touching surfaces are provided.

Figure 4:
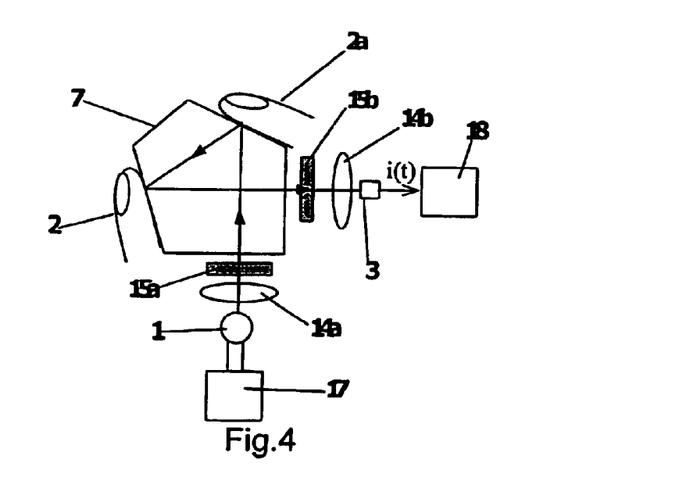
FIG. 4 is an optical touch switch architecture based on the use of one penta prism.

FIG. 4 manifests the optical touch switch structure that uses one penta prism 7. This penta prism-based optical touch switch architecture also provides two touching surfaces.

Figure 5:
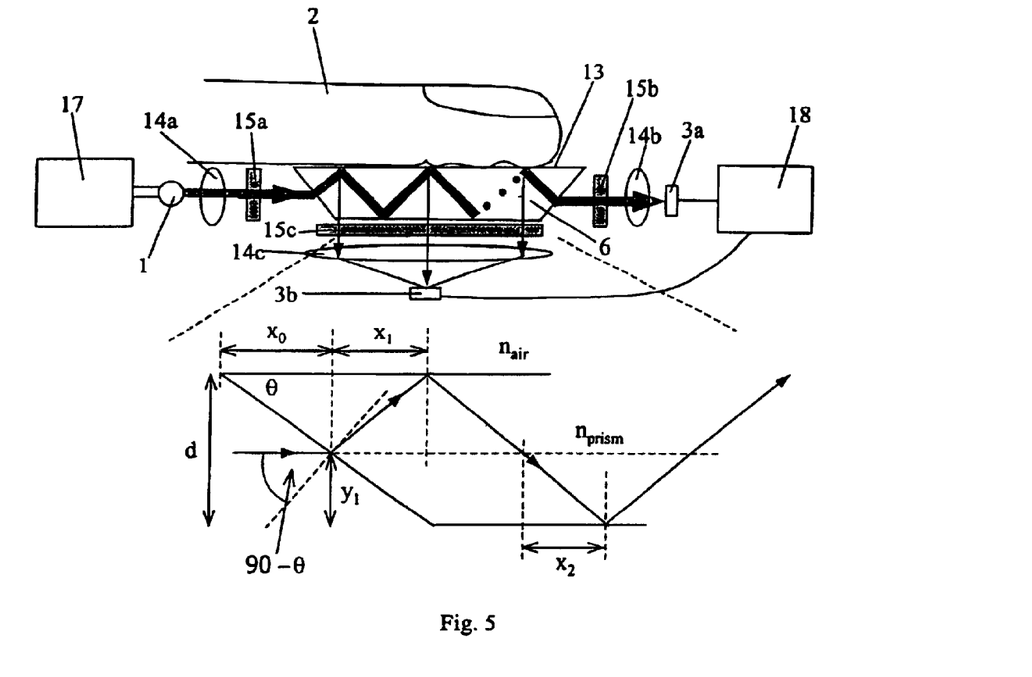
FIG. 5 is an optical touch switch architecture based on the use of one slab lightguide.

FIG. 5 shows the optical touch switch configuration that employs a slab lightguide 8 made from the material that has the index of refraction greater than air. In this configuration, the light TIR and light scattering concepts can also be employed. For the optical touch switch that utilizes the TIR concept, the optical beam from the light source 1 is directed to the slab lightguide 8 and encounters multiple reflections inside the slab lightguide 8. The optical beam then goes to the photodetector 3a. When there is no fingertip 2 on the slab lightguide 8, the photodetector 3a will give a constant electrical current to the electronic control box. The electrical current from the photodetector 3a can be changed when the fingertip 2 is placed on the slab lightguide 8. Combination of light TIR and light scattering concepts can lead to a more sensitive optical touch switch.

Figure 6:
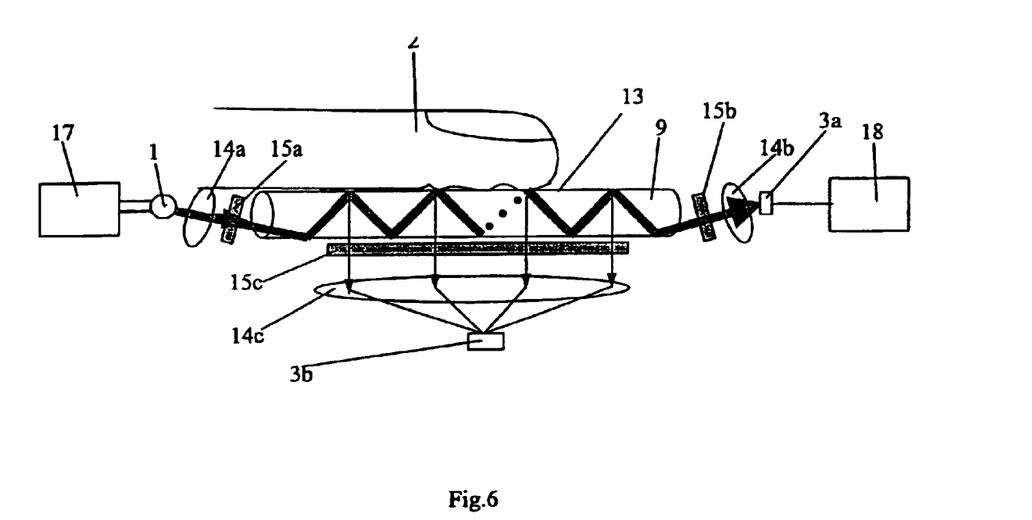
FIG. 6 is an optical touch switch architecture based on the use of optical fiber.

Instead of using a slab lightguide 8, the optical fiber 9 can also be used as the lightguide as shown in FIG. 6. This optical fiber 9 can be made from glass, polymer, and semiconductor materials that have the refractive index greater than air. Light TIR and light scattering approaches can also be employed in this configuration.

Figure 7A:
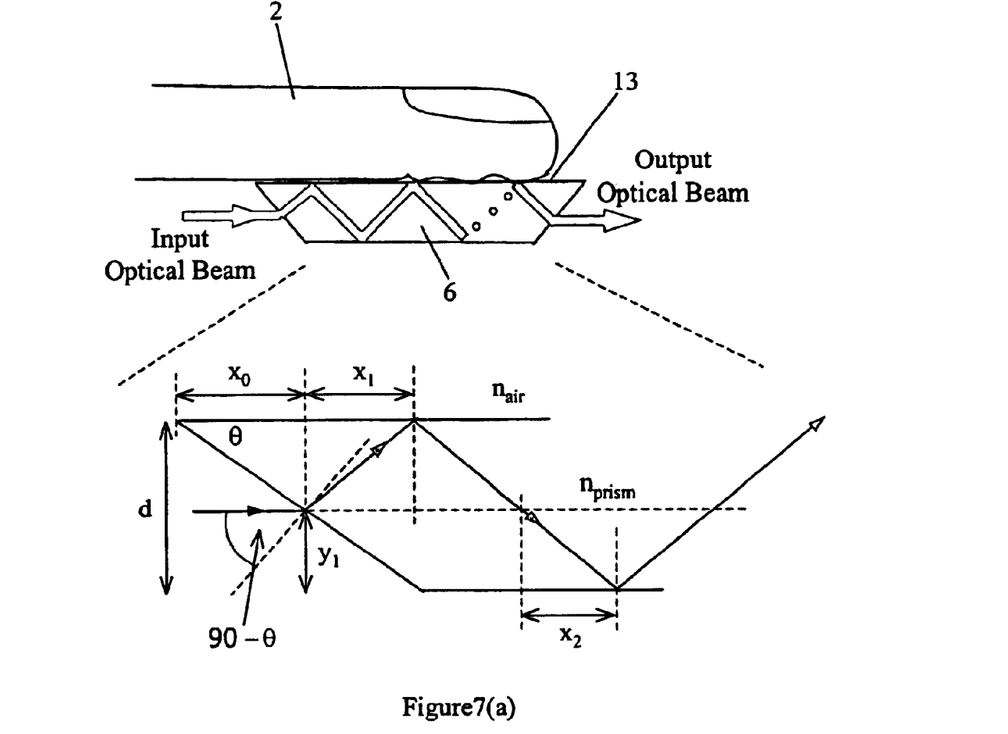
FIGS. 7(a) and 7(b) show an example of designing an optical touch switch using a Dove prism and optical an optical fiber.
Figure 7B:
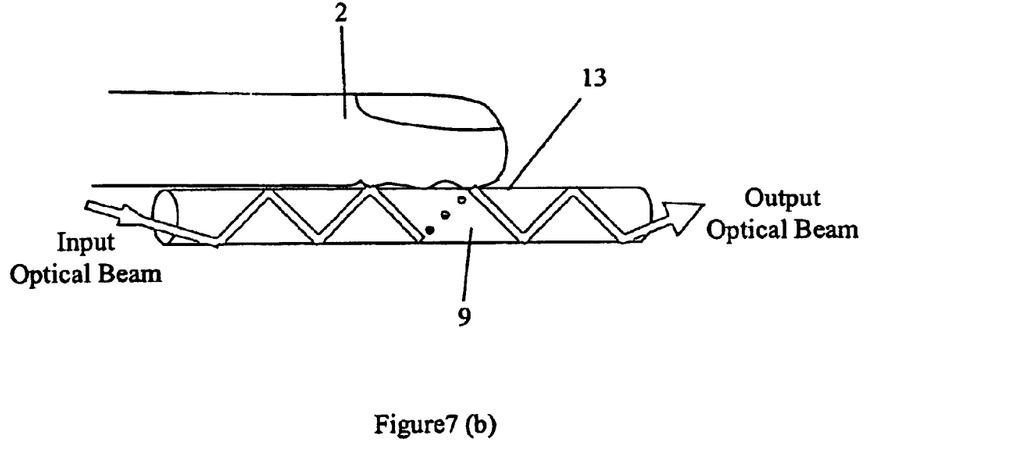

FIGS. 7(a) and 7(b) show an example of designing the Dove prism-based optical touch switch as shown in FIG. 3(a). Given the geometry of the Dove prism 6 shown in FIG. 7(a), the required minimum length (L) for the touching surface 13 of the Dove prism 6 can be written as $$L = 2x_0 + 2Nx_1 + 2(N-1)x_2, \quad (1)$$

$$L = 2(d - y_1)/\tan\theta + 2N(d - y_1)\tan\left\{\sin^{-1}\left[\frac{\cos\theta}{n_{prism}}\right] + \theta\right\} +$$

$$2(N-1)y_1\tan\left\{\sin^{-1}\left[\frac{\cos\theta}{n_{prism}}\right] + \theta\right\}$$

where d is thickness of the Dove prism 6, $y_1$ is the position of the incident optical beam from the bottom of the Dove prism 6, $\theta$ is the angle of the Dove prism 6, $n_{prism}$ is the refractive index of Dove prism material, and N is the number of TIR points along the touching surface 13 of the optical touch switch. For the optical fiber 9 and the thin slab lightguide 8 that have no angle facets, equation (1) can also be applied by means of setting $x_0=0$.

Figure 8:
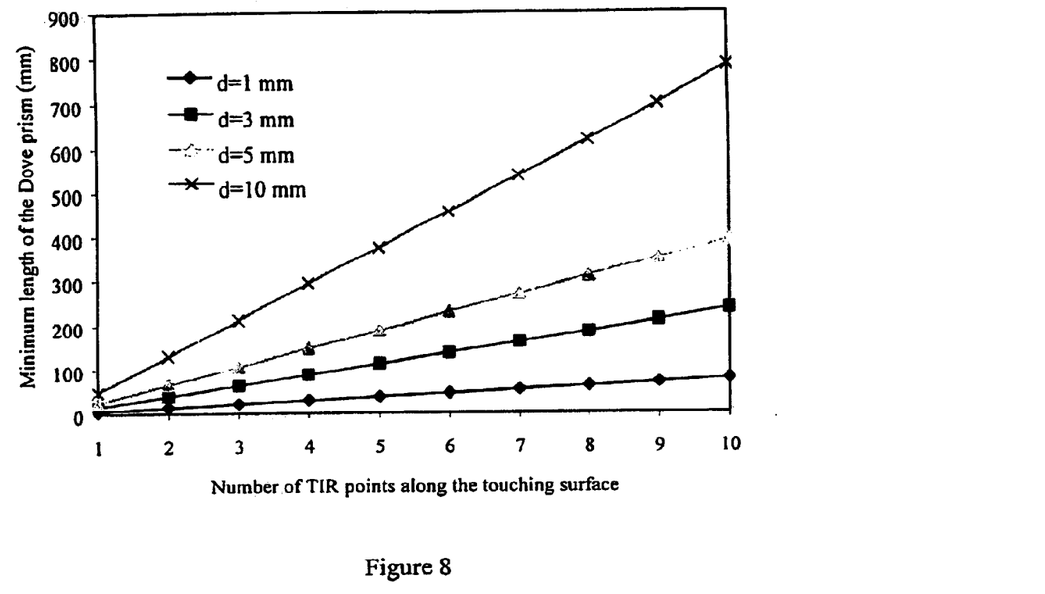
FIG. 8 is a simulation plot between the number of TIR points along the touching surface and the minimum length of the Dove prism for different Dove prism thicknesses.
Figure 9:
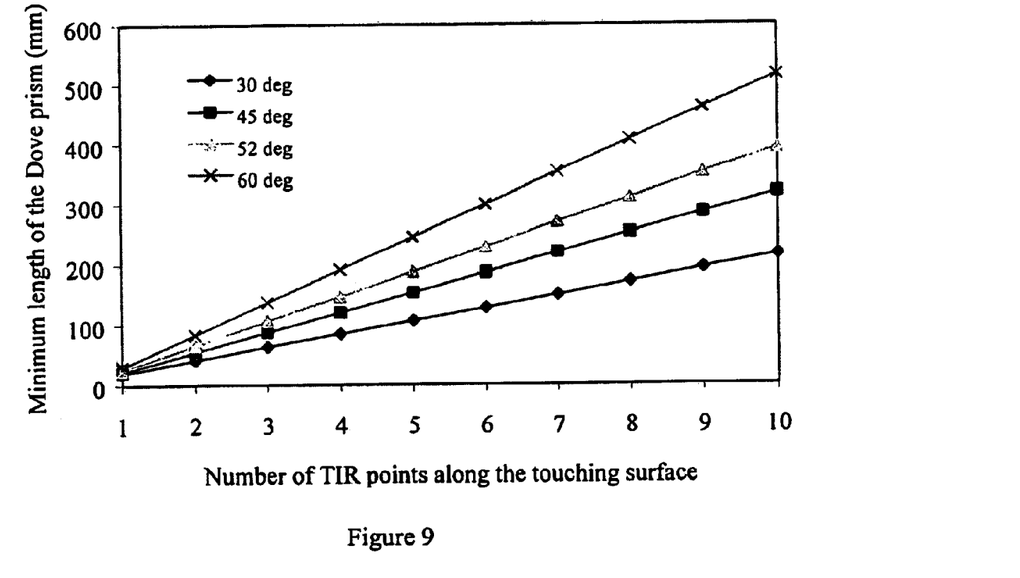
FIG. 9 is a simulation plot between the number of TIR points along the touching surface and the minimum length of the Dove prism for different Dove prism angles.

FIG. 8 shows the simulation plot of equation (1) between the required minimum length of the Dove prism 6 and the number of TIR points along the touching surface 13 for different Dove prism thicknesses with a fixed Dove prism angle of 52° and a fixed position of the incident optical beam at $y_1=d/2$. It can be noticed that for a given minimum length of Dove prism 6, the number of TIR points along the touching surface 13 can be increased when the thickness of the Dove prism 6 reduces. Another interesting case from equation (1) is shown in FIG. 9 in which the Dove prism angle is varied while the thickness of the Dove prism 6 is kept constant. FIG. 9 indicates that for a fixed Dove prism thickness and a fixed minimum length of the Dove prism 6, a more number of TIR points along the touching surface can be increased by reducing the angle of the Dove prism 6.

Although the present invention has been fully described in connection with the preferred embodiment thereof with reference to the accompanying drawings, it is to be noted that various changes and modifications are apparent to those skilled in the art. For example, while the lock is hereinabove described as having substantially cylindrical cup-shaped members, it would be a simple design choice to select any workable geometric configuration for the members. Such changes and modifications are to be understood as included within the scope of the present invention as defined by the appended claims, unless they depart therefrom.

What is claimed is:

1. An apparatus for an optical touch switch being operated by contact, comprising:
    an optical touch switch having at least one touching surface;
    a light source for illuminating the optical touch switch and generating an optical beam that senses a mechanical activating force applied on the at least one touching surface of the optical touch switch;
    a light guide operationally connected to said at least one touching surface such that total internal reflection or light scattering of said optical beam is generated due to application of said mechanical activating force;
    at least one photodetector for detecting light due to internal reflection or light scattering phenomenon;
    a plurality of imaging systems for controlling a size of said optical beam and a direction of light propagation for said optical beam;
    wherein at least one of said plurality of imaging systems is placed between said light source and said at least one photodetector;
    a plurality of spatial filters for controlling the size of said optical beam and said direction of light propagation and for suppressing unwanted optical noise,
    wherein at least one of said plurality of spatial filters is positioned adjacent to one of said plurality of imaging systems, another of said plurality of spatial filters is positioned adjacent to said light guide, and said at least one photodetector is positioned adjacent to at least one of said spatial filters; and
    an electronic control box for sensing changes of an electrical current produced by at least one photodetector and for controlling an electrical load connected at an output of said electronic box,
    wherein a size, a direction of light propagation and reduction of unwanted optical noise of said optical beam from said light source are controlled by said imaging system, and
    a size, a direction of light propagation and reduction of unwanted optical noise of said optical beam from said light guide are controlled by said spatial filters.

2. The optical touch switch apparatus of claim 1, wherein said light guide is a triangle prism.

3. The optical touch switch apparatus of claim 1, wherein said light guide is a Rhomboid prism.

4. The optical touch switch apparatus of claim 1, wherein said light guide is a Dove prism.

5. The optical touch switch apparatus of claim 1, wherein said light guide is a penta prism or polyangle prism.

6. The optical touch switch apparatus of claim 1, wherein said light guide is a slab rectangular light guide made from plastic, glass, or polymer.

7. The optical touch switch apparatus of claim 1, wherein said light guide is an optical fiber made from at least one of glass, plastic, and polymer.

8. The optical touch switch apparatus as set forth in any of claims 2–7, wherein said light guide is one of a triangle prism, a Rhomboid prism, a penta prism, a polyangle prism, a slab rectangular light guide made from plastic, glass, or polymer, and an optical fiber made from at least one of glass, plastic, and polymer; and wherein the light guide has at least one touching surface.

9. The optical touch switch apparatus as set forth in any of claims 2–7, wherein a total internal reflection point positioned along a touching surface of said light guide has at least one point.

10. The optical touch switch apparatus as set forth in any of claims 2–7, wherein said light scattering phenomenon along said touching surface of said light guide occurs at least at one point.

11. The optical touch switch apparatus as set forth in any of claims 2–7, wherein a surface of said touching surface of said light guide is divided into a light diffusing area, a light blocking area, and a sensing area.

* * * * *